United States Patent
Huang (10) Patent No.: US 9,312,251 B2
(45) Date of Patent: Apr. 12, 2016

(54) DISPLAY PANEL AND MANUFACTURING METHOD THEREOF

(71) Applicant: SHENZHEN CHINA STAR OPTOELECTRONICS TECHNOLOGY CO., LTD., Guangdong (CN)

(72) Inventor: Shishuai Huang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 35 days.

(21) Appl. No.: 14/391,058

(22) PCT Filed: Jun. 30, 2014

(86) PCT No.: PCT/CN2014/081097
§ 371 (c)(1),
(2) Date: Oct. 7, 2014

(87) PCT Pub. No.: WO2015/192394
PCT Pub. Date: Dec. 23, 2015

(65) Prior Publication Data
US 2015/0371977 A1      Dec. 24, 2015

(30) Foreign Application Priority Data

Jun. 19, 2014 (CN) .......................... 2014 1 0276070

(51) Int. Cl.
*H01L 29/04* (2006.01)
*H01L 29/10* (2006.01)
*H01L 25/18* (2006.01)
*H01L 25/00* (2006.01)
*H01L 25/065* (2006.01)
*H01L 27/12* (2006.01)
*H01L 23/528* (2006.01)
*H01L 23/532* (2006.01)
*H01L 23/522* (2006.01)
*H01L 21/768* (2006.01)
*H01L 21/02* (2006.01)
*H01L 21/311* (2006.01)

(52) U.S. Cl.
CPC ............ *H01L 25/18* (2013.01); *H01L 21/0217* (2013.01); *H01L 21/31111* (2013.01); *H01L 21/76802* (2013.01); *H01L 23/528* (2013.01); *H01L 23/5226* (2013.01); *H01L 23/5329* (2013.01); *H01L 23/53214* (2013.01); *H01L 23/53228* (2013.01); *H01L 25/0657* (2013.01); *H01L 25/50* (2013.01); *H01L 27/1214* (2013.01)

(58) Field of Classification Search
CPC ..... H01L 25/50; H01L 27/1214; H01L 25/18; H01L 21/76802
USPC ................ 257/59, 72; 438/106, 128
See application file for complete search history.

(56) References Cited

U.S. PATENT DOCUMENTS

| | | | | |
|---|---|---|---|---|
| 5,634,835 A * | 6/1997 | Wu | ......... | H05B 33/10 427/66 |
| 5,756,147 A * | 5/1998 | Wu | ......... | H05B 33/10 427/126.2 |
| 2015/0364437 A1* | 12/2015 | Yoshioka | ............. | H01L 23/522 257/737 |

*Primary Examiner* — Sheila V Clark
(74) *Attorney, Agent, or Firm* — Ladas & Parry LLP (57) ABSTRACT

A display panel including an array substrate and a COF substrate is provided. The COF is provided with a plurality of welded lead lines. The array substrate includes a metal layer disposed on a surface of the substrate, a silicon nitride layer disposed on a surface of the metal layer, and a plurality of terminal wires disposed in a spaced arrangement in a welding region on a surface of the second silicon nitride layer. The welding region between the adjacent terminal wires is provided with through holes, which expose the metal layer. The risk of corrosion and breakage of the welded lead lines on the COF substrate is effectively reduced.

20 Claims, 4 Drawing Sheets

DISPLAY PANEL AND MANUFACTURING METHOD THEREOF

FIELD OF THE INVENTION

The present invention relates to the technical field of display devices, and in particular to a display panel and a manufacturing method thereof.

BACKGROUND OF THE INVENTION

In a normal display of TFT-LCD (Thin Film Transistor Liquid Crystal Display) panel, a COF (Chip On Film) substrate is required to connect a PCB (Printed Circuit Board) and a liquid crystal panel, so that the signal can be transmitted to the panel from the PCB.

Figure 1:
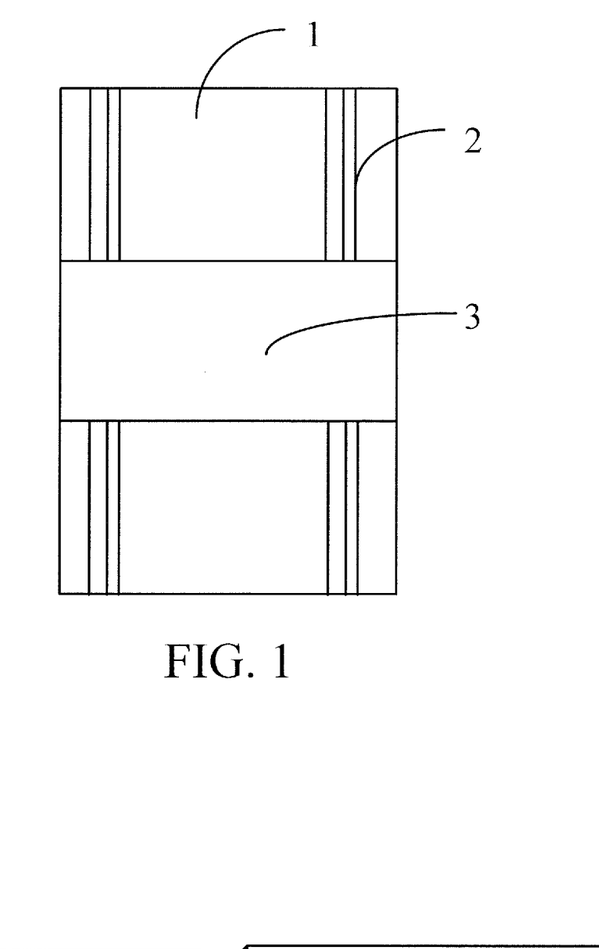
FIG. 1 is a schematic structural diagram of a COF substrate provided by prior art.

As shown in FIG. 1, welded lead lines 2 are disposed on a COF substrate 1, and the welded lead lines 2 are coated with a protective layer 3. Since copper has good thermal conductivity properties and excellent flexibility, copper is often used as the material of the welded lead line. The welded lead lines which remain uncoated with the protective layer on the COF substrate are used to connect terminal wires of the crystal panel.

Figure 2:
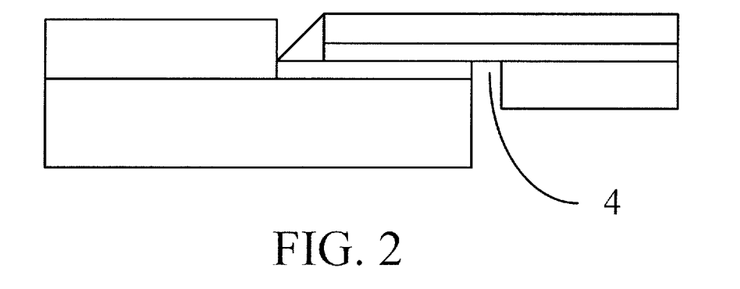
FIG. 2 is a schematic structural diagram showing that portions of welded lead lines are exposed to air on a COF substrate provided by prior art.

In the module stage, after the completion of the welding of the COF substrate, a layer of tuffy resin is coated on a lateral side of the thin-film transistor of the liquid crystal panel for preventing the terminal wires of the liquid crystal panel from being corroded with H₂O and chloride ions. However, due to the limitations of the manufacturing process, the tuffy resin is generally not coated on the back surface of the COF substrate. As shown in FIG. 2, therefore, portions of the welded lead lines on the COF substrate are exposed to air. Although copper has strong corrosion resistance, and is not easily corroded by water vapor, when ions are present in the environment, an electrochemical reaction occurs, and copper will still be corroded. This is particularly true when chloride ion are present, as chloride ions have strong properties of penetration and are easily hydrolyzed to acid, so as to greatly speed up the following electrochemical reaction, and cause point corrosion, pit corrosion, and even breakage of the exposed copper in severe cases, thereby affecting the signal transmission. The electrochemical reaction is as follows:

SUMMARY OF THE INVENTION

An object of the present invention is to provide a display panel and a manufacturing method thereof for resolving the problem arising from the welded lead lines being exposed to air on the COF substrate after the completion of the welding of the COF substrate. When ions are present in air in the environment, an electrochemical reaction occurs, and the welded lead lines will be corroded, thereby affecting the signal transmission.

To achieve the above object, a display panel comprises an array substrate and a COF substrate provided with a plurality of welded lead lines, wherein the array substrate comprises:

a substrate,
a first metal layer disposed on a surface of the substrate surface,
a first silicon nitride layer disposed on the first metal layer,
a second metal layer disposed on the first silicon nitride layer,
a second silicon nitride layer disposed on the second metal layer, and
a plurality of terminal wires disposed in a spaced arrangement in a welding region on a surface of the second silicon nitride layer, the welding region being a region where the terminal wires are connected with the welded lead lines,
wherein each of the terminal wires is laminated and connected with a corresponding one of the welded lead lines on the COF substrate, and portions of the welding region between the adjacent terminal wires are provided with through holes which expose the metal layer.

According to an embodiment of the present invention, the welding region between the adjacent terminal wires is provided with through holes which expose the first metal layer.

According to an embodiment of the present invention, the welding region between the adjacent terminal wires is provided with through holes which expose the second metal layer.

According to an embodiment of the present invention, the material of the first silicon nitride layer comprises G-silicon nitride, and the material of the second silicon nitride layer comprises D-silicon nitride.

According to an embodiment of the present invention, the materials of the first metal layer and the second metal layer comprise aluminum.

According to an embodiment of the present invention, the materials of the first metal layer and the second metal layer comprise copper.

Another object of the present invention is to provide a manufacturing method for a display panel. The display panel comprises an array substrate and a COF substrate. The COF substrate is provided with a plurality of welded lead lines. The manufacturing method for a display panel comprises steps of:

providing a substrate, forming a metal layer and a silicon nitride layer on the substrate successively,
disposing a plurality of terminal wires in a spaced arrangement in a welding region on a surface of the silicon nitride layer on the substrate, the welding region being a region where the terminal wires are connected with the welded lead line,
forming through holes by through hole etching in the welding region between the adjacent terminal wires so that the through holes expose the metal layer, and laminating and connecting each of the terminal wires with a corresponding one of the welded lead lines.

The step of forming the metal layer and the silicon nitride layer successively further comprises:

forming a first metal layer on the substrate,
forming a first silicon nitride layer on the first metal layer,
forming a second metal layer on the first silicon nitride layer, and
forming a second silicon nitride layer on the second metal layer, and the step of disposing a plurality of terminal wires in a spaced arrangement in a welding region on a surface of the silicon nitride layer on the substrate comprises:
disposing a plurality of terminal wires in a spaced arrangement in a welding region on a surface of the second silicon nitride layer on the substrate.

According to an embodiment of the present invention, the step of forming through holes by through hole etching in the welding region between the adjacent terminal wires, so that the through holes expose the metal layer, comprises:

forming through holes by through hole etching successively in the second silicon nitride layer, the second metal layer, and the first silicon nitride layer between the adjacent terminal wires, so that the through holes expose the first metal layer.

According to an embodiment of the present invention, the step of forming through holes by through hole etching in the welding region between the adjacent terminal wires, so that the through holes expose the metal layer, comprises:

forming through holes by through hole etching in the second silicon nitride layer between the adjacent terminal wires, so that the through holes expose the second metal layer.

According to an embodiment of the present invention, the welding region between each of the adjacent terminal wires is provided with through holes.

Another object of the present invention is to provide a display panel comprising an array substrate and a COF substrate. The COF substrate provided with a plurality of welded lead lines, wherein the array substrate comprises:
a substrate,
a metal layer disposed on a surface of the substrate,
a silicon nitride layer disposed on a surface of the metal layer, and
a plurality of terminal wires disposed in a spaced arrangement in a welding region on a surface of the silicon nitride layer, the welding region being a region where the terminal wires are connected with the welded lead lines,
wherein each of the terminal wires is laminated and connected with a corresponding one of the welded lead lines on the COF substrate, and portions of the welding region between the adjacent terminal wires are provided with through holes which expose the metal layer.

The metal layer comprises a first metal layer and a second metal layer, the silicon nitride layer comprises a first silicon nitride layer and a second silicon nitride layer;

the first metal layer disposed on a surface of the substrate surface;
the first silicon nitride layer disposed on the first metal layer;
the second metal layer disposed on the first silicon nitride layer;
the second silicon nitride layer disposed on the second metal layer; and
the plurality of the terminal wires disposed in a spaced arrangement in a welding region on a surface of the second silicon nitride layer.

The welding region between the adjacent terminal wires is provided with through holes which expose the first metal layer.

The welding region between the adjacent terminal wires is provided with through holes which expose the second metal layer.

The welding region between each of the adjacent terminal wires is provided with through holes.

In the present invention, the through holes are formed by through hole etching in the welding region between the adjacent terminal wires on the array substrate, and the through holes expose the metal layer on the array substrate, so that when the terminal wires on the array substrate are connected with the welded lead lines on the COF substrate, since the exposed welded lead lines are located on the edge of the through hole region, and the through hole region exposes the metal layer, even if air is present around the exposed welded lead lines, the metal layer can share the risk of corrosion of the welded lead lines, thereby delaying the time and the speed of the corrosion of the welded lead lines. The present invention effectively reduces the risk of corrosion and breakage of the welding wires, increases the use time of products, and prolongs the longevity of the products.

DETAILED DESCRIPTION OF THE PREFERRED EMBODIMENTS

To make the objects, technical solutions, and beneficial effects of the present invention clearly understood, the present invention is described in detail below by reference to the accompanying drawings and embodiments. It should be understood that the specific embodiments described herein are merely to illustrate the invention, and are not intended to limit the present invention.

In the present invention, the through holes are formed by through hole etching in the welding region between the adjacent terminal wires on the array substrate, and the through holes expose the metal layer on the array substrate, so that when the terminal wires on the array substrate are connected with the welded lead lines on the COF substrate, since the exposed welded lead lines are located on the edge of the through hole region, and the through hole region exposes the metal layer, even if air is present around the exposed welded lead lines, the metal layer can share the risk of corrosion of the welded lead lines, thereby delaying the time and the speed of the corrosion of the welded lead lines. The problem is resolved which arises from the welded lead lines being exposed to air on the COF substrate after the completion of the welding of the COF substrate. When ions are present in the air in the environment, an electrochemical reaction occurs, and the welded lead lines will be corroded, thereby affecting the signal transmission.

In the embodiment of the present invention, only parts related to the embodiment of the present invention are shown for convenience of illustration. A display panel includes an array substrate, and a COF substrate, and the plurality of welded lead lines are disposed on the COF substrate.

Figure 3:
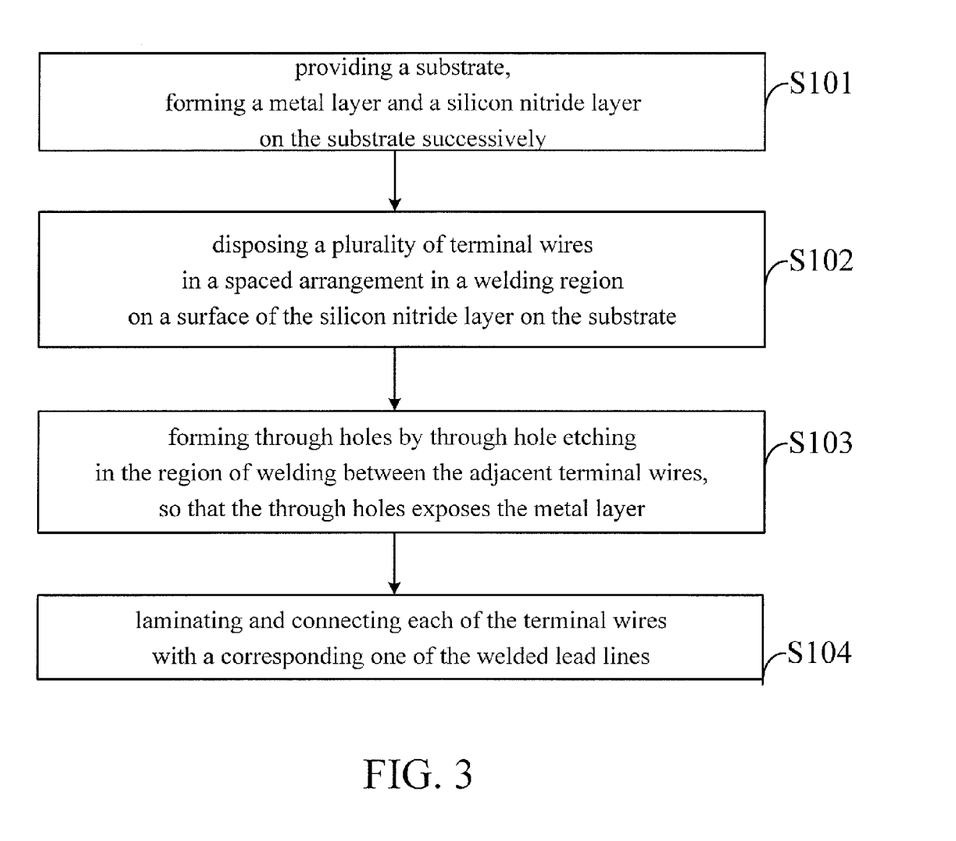
FIG. 3 is a schematic flowchart of implementation of a manufacturing method for a display panel provided by au embodiment of the present invention.

FIG. 3 is a schematic flowchart of implementation of a manufacturing method for a display panel provided by an embodiment of the present invention. A manufacturing method for a display panel includes steps of:

providing a substrate, and forming a metal layer and a silicon nitride layer successively on the substrate in step S101.

In the embodiment of the present invention, step S101 includes steps of:

forming a first metal layer on the substrate, forming a first silicon nitride layer on the first metal layer, forming a second metal layer on the first silicon nitride layer, and forming a second silicon nitride layer on the second metal layer.

However, it should be appreciated that the forming the first metal layer, a second metal layer, a first silicon nitride layer, and a second layer of silicon nitride layer requires steps of applying a photoresist layer, exposing, developing, and etching. Since these techniques are commonly used in the field, they are not discussed redundantly herein.

Preferably, the material used to form the first silicon nitride layer is a G-silicon nitride layer, and the material used to form the second silicon nitride layer is a D-silicon nitride layer. The material used to form the first metal layer and the second metal layer can be aluminum, copper or other metallic materials. However, it is understood that the foregoing is only a preferred embodiment of the invention, and not intended to limit the present invention. Any modification, equivalent substitution and improvement within the spirit and principles of the present invention are included within the scope of the present invention.

In step S102, a plurality of terminal wires are disposed in a spaced arrangement in a welding region on a surface of the silicon nitride layer, the welding region being a region where the terminal wires are connected with the welded lead lines.

In the embodiment of the present invention, when there are two layers of silicon nitride layer, step S102 includes:

disposing a plurality of terminal wires in a spaced arrangement in a welding region on a surface of the second silicon nitride layer, the welding region being a region where the terminal wires are connected with the welded lead lines.

In step S103, through holes are formed by through hole etching in the welding region between the adjacent terminal wires, and the through holes expose the metal layer.

In a first embodiment of the present invention, step S103 includes steps of forming through holes successively by through hole etching in the second silicon nitride layer, the second metal layer, and the first silicon nitride layer between the adjacent terminal wires, and the through holes expose the first metal layer.

In the embodiment of the present invention, when the material used as the exposed first metal layer is aluminum, and when the terminal wires on the array substrate connect the welded lead lines on the COF substrate, since the exposed welded lead lines are located on the edge of the through hole region, the through hole region exposes the aluminum metal layer, and as aluminum has a tendency of losing electrons, even if air is present around the exposed welded lead lines, the aluminum preferentially loses electrons in the environment where water vapor and ions exist, and an electrochemical reaction occurs. Therefore, air preferentially reacts with the aluminum electrochemically, thereby delaying the time of the corrosion of the copper welded lead lines on the GOF substrate.

In the embodiment of the present invention, when the material used as the first metal layer is copper, and when the terminal wires on the array substrate connect the welded lead lines on the COF substrate, since the exposed welded lead lines are located on the edge of the through hole region, and the through hole region exposes the copper metal layer, even if air is present around the exposed welded lead lines, the copper metal layer can consume a portion of water vapor and ions, thereby sharing the risk of corrosion of the copper welded lead lines on the GOF substrate.

In a second embodiment of the present invention, step S103 includes steps of: forming through holes by through hole etching in the second silicon nitride layer between the adjacent terminal wires, and the through holes expose the second metal layer.

In the embodiment of the present invention, when the material used as the exposed second metal layer is aluminum, and when the terminal wires on the array substrate connect the welded lead lines on the COF substrate, since the exposed welded lead lines are located on the edge of the through hole region, the through hole region exposes the aluminum metal layer, and as aluminum has a tendency of losing electrons, even if air is present around the exposed welded lead lines, the aluminum preferentially loses electrons in the environment where water vapor and ions exist, and an electrochemical reaction occurs. Therefore, air preferentially reacts with the aluminum electrochemically, thereby delaying the time of the corrosion of the copper welded lead lines on the GOF substrate.

In the embodiment of the present invention, when the material used as the second metal layer is copper, and when the terminal wires on the array substrate connect the welded lead lines on the COF substrate, since the exposed welded lead lines are located on the edge of the through hole region, and the through hole region exposes the copper metal layer, even if air is present around the exposed welded lead lines, the copper metal layer can consume a portion of water vapor and ions, thereby sharing the risk of corrosion of the copper welded lead lines on the GOF substrate.

Preferably, in order to better avoid the risk of corrosion and breakage of the welded lead lines, the welding region between each of the adjacent terminal wires is provided with through holes.

In step S104, each of the terminal wires is laminated and connected with a corresponding one of the welded lead lines on the COF substrate.

Figure 4:
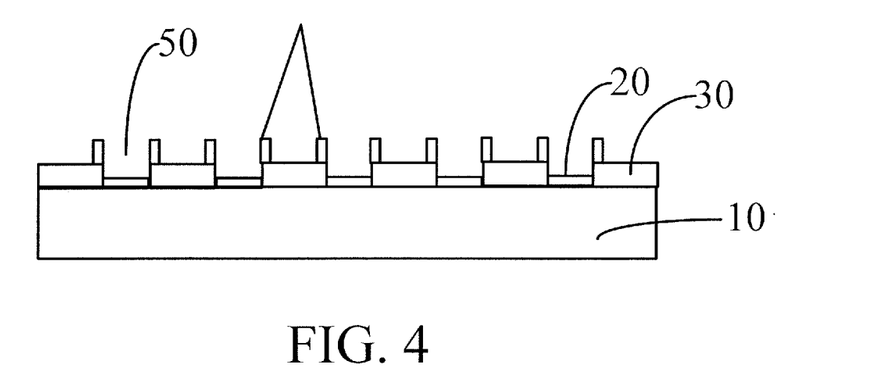
FIG. 4 is a schematic structural diagram of a display panel provided by an embodiment of the present invention.

FIG. 4 is a schematic structural diagram of a display panel provided by a first embodiment of the present invention. Only parts related to the embodiment of the present invention are shown for convenience of illustration. The display panel includes an array substrate, and a COF substrate, and the plurality of welded lead lines are disposed on the COF substrate.

The array substrate includes a substrate 10, a metal layer 20, a silicon nitride layer 30, and a plurality of terminal wires 40.

The metal layer 20 is disposed on the surface of the substrate 10. The silicon nitride layer 30 is disposed on the surface of the metal layer 20. A plurality of terminal wires 40 are disposed in a spaced arrangement in a welding region on a surface of the silicon nitride layer 30. The welding region is a region where the terminal wires are connected with the welded lead lines.

Each of the terminal wires 40 is laminated and connected with a corresponding one of the welded lead lines on the COF substrate, and portions of the welding region between the adjacent terminal wires 40 is provided with through holes 50 which expose the metal layer 20.

Figure 5:
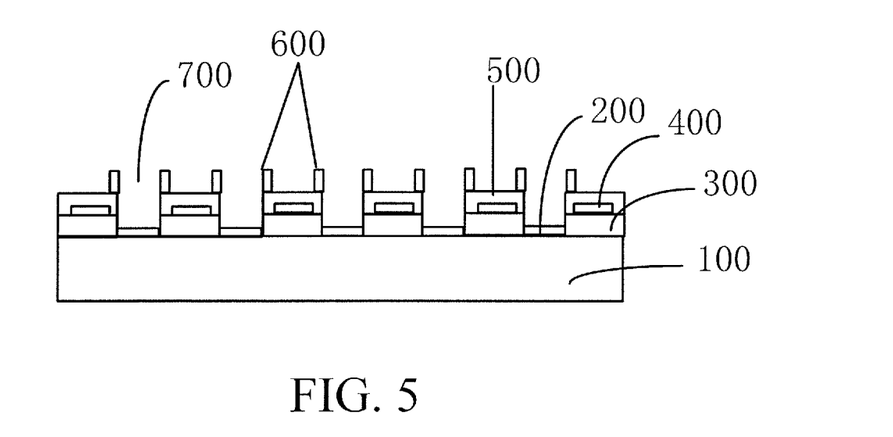
FIG. 5 is a schematic structural diagram of all silicon nitride layers and a second metal layer after being etched provided by an embodiment of the present invention.
Figure 6:
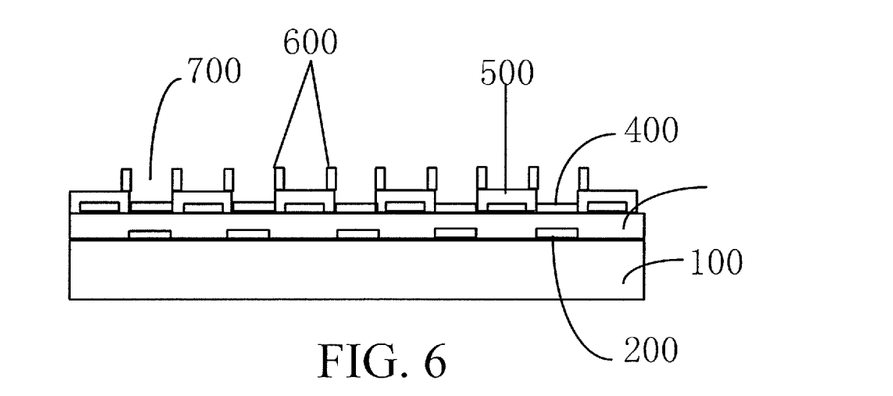
FIG. 6 is a schematic structural diagram of a second silicon nitride layer after being etched provided by an embodiment of the present invention.

FIG. 5 and FIG. 6 are schematic structural diagrams of a display panel provided by a second embodiment of the present invention. Only parts related to the embodiment of the present invention are shown for convenience of illustration.

The display panel includes an array substrate and a COF substrate. A plurality of welded lead lines are disposed on the COF substrate.

The array substrate includes a substrate 100, a first metal layer 200, a first silicon nitride layer 300, a second metal layer 400, a second silicon nitride layer 500, and a plurality of terminal wires 600.

The first metal layer 200 is disposed on the surface of the substrate 100, the first silicon nitride layer 300 is disposed on the first metal layer 200, the second metal layer 400 is disposed on the first silicon nitride layer 300, the second silicon nitride layer 500 is disposed on the second metal layer 400, and a plurality of the terminal wires 600 are disposed in a spaced arrangement in a welding region on a surface of the second silicon nitride layer 500. The welding region is a region where the terminal wires 600 are connected with the welded lead lines.

Each of the terminal wires 600 is laminated and connected with a corresponding one of the welded lead lines on the COF substrate, and portions of the welding region between the adjacent terminal wires 600 is provided with through holes 700. The through holes are used to expose the first metal layer 200 or the second metal layer 400.

Preferably, the material used as the first silicon layer 300 is a G-silicon nitride layer, and the material used as the second silicon layer 500 is a D-silicon nitride layer. The material used as the first metal layer 200 and a second metal layer 400 can be aluminum, copper, or other metallic materials. However, it is understood that the foregoing are only preferred embodiments of the present invention, and are not intended to limit the present invention. Any modifications, equivalent substitutions, and improvements within the spirit and principles of the present invention are included within the scope of the present invention.

In the first embodiment of the present invention, through holes 700 are formed by through hole etching successively in the second silicon nitride layer 500, the second metal layer 400, and the first silicon nitride layer 300, between the adjacent terminal wires 600. The through holes 700 expose the first metal layer 200, as shown in FIG. 5.

In the embodiment of the present invention, when the material used as the exposed first metal layer 200 is aluminum, and when the terminal wires 600 on the array substrate connect the welded lead lines on the COF substrate, since the exposed welded lead lines are located on the edge of the through hole 700 region, the through hole 700 region exposes the aluminum metal layer, and as aluminum has a tendency of losing electrons, even if air is present around the exposed welded lead lines, the aluminum preferentially loses electrons in the environment where water vapor and ions exist, and an electrochemical reaction occurs. Therefore, air preferentially reacts with the aluminum electrochemically, thereby delaying the time of the corrosion of the copper welded lead lines on the GOF substrate and reducing the speed of the corrosion of the copper welded lead lines.

In the embodiment of the present invention, when the material used as the first metal layer 200 is copper, and when the terminal wires 600 on the array substrate connect the welded lead lines on the COF substrate, since the exposed welded lead lines are located on the edge of the through hole 700 region, and the through hole 700 region exposes the copper metal layer, even if air is present around the exposed welded lead lines, the copper metal layer can consume a portion of water vapor and ions, thereby sharing the risk of corrosion of the copper welded lead lines on the GOF substrate.

In the second embodiment of the present invention, through holes 700 are formed by through hole etching in the second silicon nitride layer 500 between the adjacent terminal wires 600. The through holes 700 expose the second metal layer 400, as shown in FIG. 6.

In the embodiment of the present invention, when the material used as the exposed second metal layer 400 is aluminum, and when the terminal wires 600 on the array substrate connect the welded lead lines on the COF substrate, since the exposed welded lead lines are located on the edge of the through hole 700 region, the through hole 700 region exposes the aluminum metal layer, and as aluminum has a tendency of losing electrons, even if air is present around the exposed welded lead lines, the aluminum preferentially loses electrons in the environment where water vapor and ions exist, and an electrochemical reaction occurs. Therefore, air preferentially reacts with the aluminum electrochemically, thereby delaying the time of the corrosion of the copper welded lead lines on the GOF substrate and reducing the speed of the corrosion of the copper welded lead lines.

In the embodiment of the present invention, when the material used as the second metal layer 400 is copper, and when the terminal wires 600 on the array substrate connect the welded lead lines on the COF substrate, since the exposed welded lead lines are located on the edge of the through hole 700 region, and the through hole 700 region exposes the copper metal layer, even if air is present around the exposed welded lead lines, the copper metal layer can consume a portion of water vapor and ions, thereby sharing the risk of corrosion of the copper welded lead lines on the GOF substrate.

Figure 7:
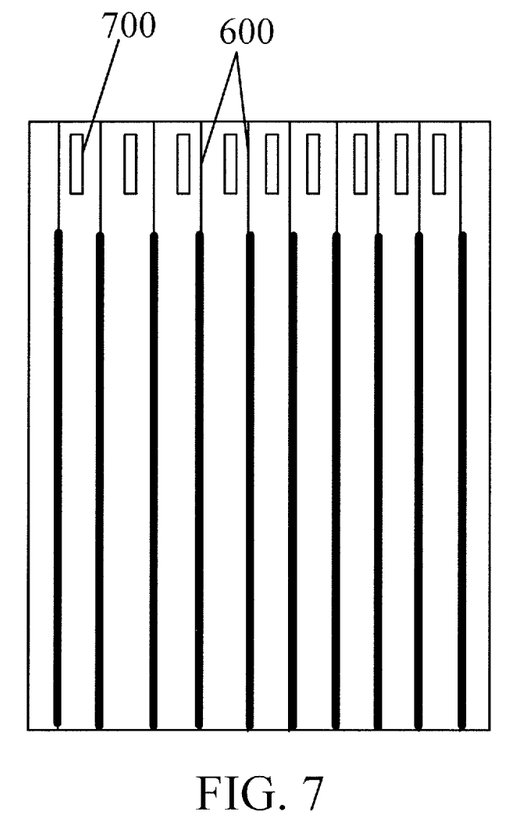
FIG. 7 is a schematic structural diagram of through holes disposed between adjacent terminals.

Preferably, in order to better avoid the risk of corrosion and breakage of the welded lead lines, the welding region between each of the adjacent terminal wires 600 is provided with through holes 700. FIG. 7 is a schematic structural diagram of through holes 700 disposed between the adjacent terminal wires 600 on the array substrate.

In summary, the through holes are formed by through hole etching in the welding region between the adjacent terminal wires on the array substrate, and the through holes expose the metal layer on the array substrate, so that when the terminal wires on the array substrate are connected with the welded lead lines on the COF substrate, since the exposed welded lead lines are located on the edge of the through hole region, and the through hole region exposes the metal layer, even if air is present around the exposed welded lead lines, the metal layer can share the risk of corrosion of the welded lead lines, thereby delaying the time and the speed of the corrosion of the welded lead lines. Furthermore, when the material used as the exposed metal layer is aluminum, and when the terminal wires on the array substrate connect the welded lead lines on the COF substrate, since the exposed welded lead lines are located on the edge of the through hole region, the through hole region exposes the aluminum metal layer, and as aluminum has a tendency of losing electrons, even if air is present around the exposed welded lead lines, the aluminum preferentially loses electrons in the environment where water vapor and ions exist, and an electrochemical reaction occurs. Therefore, air preferentially reacts with the aluminum electrochemically, thereby delaying the time of the corrosion of the copper welded lead lines on the GOF substrate and reducing the speed of the corrosion of the copper welded lead lines. Moreover, the material used as the metal layer is copper, and when the terminal wires on the array substrate connect the welded lead lines on the COF substrate, since the exposed welded lead lines are located on the edge of the through hole region, and the through hole region exposes the copper metal layer, even if air is present around the exposed welded lead lines, the copper metal layer can consume a portion of water vapor and ions, thereby sharing the risk of corrosion of the copper welded lead lines on the GOF substrate. The present invention effectively reduces the risk of corrosion and breakage of the welding wires, increases the use time of products, and prolongs the longevity of the products.

The foregoing are only preferred embodiments of the invention, and are not intended to limit the present invention. Any modifications, equivalent substitutions, and improvements within the spirit and principles of the present invention are included within the scope of the present invention.

What is claimed is:

1. A display panel comprising an array substrate and a COF substrate provided with a plurality of welded lead lines, wherein
the array substrate comprises:
a substrate;
a first metal layer disposed on a surface of the substrate;
a first silicon nitride layer disposed on the first metal layer;
a second metal layer disposed on the first silicon nitride layer;
a second silicon nitride layer disposed on the second metal layer; and
a plurality of terminal wires disposed in a spaced arrangement in a welding region on a surface of the second silicon nitride layer, the welding region being a region where the terminal wires are connected with the welded lead lines,
wherein each of the terminal wires is laminated and connected with a corresponding one of the welded lead lines on the COF substrate, and portions of the welding region between the adjacent terminal wires are provided with through holes which expose the metal layer.

2. The display panel as claimed in claim 1, wherein the welding region between the adjacent terminal wires is provided with through holes which expose the first metal layer.

3. The display panel as claimed in claim 1, wherein the welding region between the adjacent terminal wires is provided with through holes which expose the second metal layer.

4. The display panel as claimed in claim 1, wherein the material of the first silicon nitride layer comprises G-silicon nitride, and the material of the second silicon nitride layer comprises D-silicon nitride.

5. The display panel as claimed in claim 1, wherein the materials of the first metal layer and the second metal layer comprise aluminum.

6. The display panel as claimed in claim 1, wherein the materials of the first metal layer and the second metal layer comprise copper.

7. A manufacturing method for a display panel, which has an array substrate and a COF substrate provided with a plurality of welded lead lines, comprising steps of:
providing a substrate, forming a metal layer and a silicon nitride layer on the substrate successively;
disposing a plurality of terminal wires in a spaced arrangement in a welding region on a surface of the silicon nitride layer on the substrate, which is a region where the terminal wires are connected with the welded lead lines;
forming through holes by through hole etching in the welding region between the adjacent terminal wires, so that the through holes exposes the metal layer; and
laminating and connecting each of the terminal wires with a corresponding one of the welded lead lines.

8. The manufacturing method for a display panel as claimed in claim 7, wherein the step of forming a metal layer and a silicon nitride layer successively further comprises:
forming a first metal layer on the substrate;
forming a first silicon nitride layer on the first metal layer;
forming a second metal layer on the first silicon nitride layer; and
forming a second silicon nitride layer on the second metal layer; and
the step of disposing a plurality of terminal wires in a spaced arrangement in a welding region on a surface of the silicon nitride layer on the substrate comprises;
disposing a plurality of terminal wires in a spaced arrangement in a welding region on a surface of a second silicon nitride layer on the substrate.

9. The manufacturing method for a display panel as claimed in claim 8, wherein the step of forming through holes by through hole etching in the welding region between the adjacent terminal wires, so that the through holes exposes the metal layer, comprises:
forming through holes by through hole etching in the second silicon nitride layer, the second metal layer, and the first silicon nitride layer between the adjacent terminal wires, so that the through holes expose the first metal layer.

10. The manufacturing method for a display panel as claimed in claim 8, wherein the step of forming through holes by through hole etching in the welding region between the adjacent terminal wires, so that the through holes exposes the metal layer, comprises:
forming through holes by through hole etching in the second silicon nitride layer between the adjacent terminal wires, so that the through holes exposes the second metal layer.

11. The manufacturing method for a display panel as claimed in claim 7, wherein the welding region between each of the adjacent terminal wires is provided with through holes.

12. The display panel as claimed in claim 7, wherein the material of the first silicon nitride layer comprises G-silicon nitride, and the material of the second silicon nitride layer comprises D-silicon nitride.

13. A display panel comprising an array substrate and a COF substrate provided with a plurality of welded lead lines, wherein
the array substrate comprises:
a substrate;
a metal layer disposed on a surface of the substrate;
a silicon nitride layer disposed on a surface of the metal layer; and
a plurality of terminal wires disposed in a spaced arrangement in a welding region on a surface of the silicon nitride layer, the welding region being a region where the terminal wires are connected with the welded lead lines,
wherein each of the terminal wires is laminated and connected with a corresponding one of the welded lead lines on the COF substrate, and portions of the welding region between the adjacent terminal wires are provided with through holes which expose the metal layer.

14. The display panel as claimed in claim 13, wherein the metal layer comprises a first metal layer and a second metal layer, the silicon nitride layer comprises a first silicon nitride layer and a second silicon nitride layer;
the first metal layer disposed on a surface of the substrate surface;
the first silicon nitride layer disposed on the first metal layer;
the second metal layer disposed on the first silicon nitride layer;

the second silicon nitride layer disposed on the second metal layer; and the plurality of the terminal wires disposed in the spaced arrangement on the second silicon nitride layer in the welding region.

15. The display panel as claimed in claim 14, wherein the welding region between the adjacent terminal wires is provided with through holes which expose the first metal layer.

16. The display panel as claimed in claim 14, wherein the welding region between the adjacent terminal wires is provided with through holes which expose the second metal layer.

17. The manufacturing method for a display panel as claimed in claim 13, wherein the welding region between each of the adjacent terminal wires is provided with through holes.

18. The display panel as claimed in claim 13, wherein the material of the first silicon nitride layer comprises G-silicon nitride, and the material of the second silicon nitride layer comprises D-silicon nitride.

19. The display panel as claimed in claim 13, wherein the materials of the first metal layer and the second metal layer comprise aluminum.

20. The display panel as claimed in claim 13, wherein the materials of the first metal layer and the second metal layer comprise copper.

* * * * *